(12) United States Patent
Kiew

(10) Patent No.: US 8,994,157 B1
(45) Date of Patent: Mar. 31, 2015

(54) CIRCUIT SYSTEM IN A PACKAGE

(75) Inventor: Kelvin K. Kiew, San Jose, CA (US)

(73) Assignee: Scientific Components Corporation, Brooklyn, NY (US)

( * ) Notice: Subject to any disclaimer, the term of this patent is extended or adjusted under 35 U.S.C. 154(b) by 731 days.

(21) Appl. No.: 13/117,874

(22) Filed: May 27, 2011

(51) Int. Cl.
*H01L 23/495* (2006.01)
*H01L 23/06* (2006.01)
*H01L 21/48* (2006.01)
*H01L 23/31* (2006.01)
*H01L 23/00* (2006.01)

(52) U.S. Cl.
CPC ... *H01L 21/4832* (2013.01); *H01L 2224/45144* (2013.01); *H01L 23/3107* (2013.01); *H01L 24/97* (2013.01); *H01L 2224/48091* (2013.01)
USPC .......... 257/676; 257/666; 257/692; 257/778; 257/784; 438/106

(58) Field of Classification Search
USPC ......... 257/666, 676, 692, 784, 690, 778, 670, 257/698; 438/106
See application file for complete search history.

(56) References Cited

U.S. PATENT DOCUMENTS

| | | | |
|---|---|---|---|
| 4,169,682 A * | 10/1979 | Norman | 400/120.16 |
| 4,903,114 A * | 2/1990 | Aoki et al. | 257/666 |
| 5,177,669 A * | 1/1993 | Juskey et al. | 257/675 |
| 5,311,407 A | 5/1994 | Lumbard | |
| 5,504,370 A | 4/1996 | Lin et al. | |
| 5,685,071 A | 11/1997 | Gates et al. | |
| 6,143,981 A | 11/2000 | Glenn | |
| 6,433,277 B1 | 8/2002 | Glenn | |
| 6,455,356 B1 | 9/2002 | Glenn et al. | |
| 6,459,148 B1 | 10/2002 | Chun-Jen et al. | |
| 6,521,987 B1 | 2/2003 | Glenn et al. | |
| 6,630,728 B2 | 10/2003 | Glenn | |
| 6,740,961 B1 * | 5/2004 | Mostafazadeh | 257/676 |
| 6,803,648 B1 | 10/2004 | Kelkar et al. | |
| 6,965,157 B1 * | 11/2005 | Perez et al. | 257/666 |
| 7,030,474 B1 | 4/2006 | Glenn | |
| 7,064,419 B1 | 6/2006 | Bayan et al. | |
| 7,211,471 B1 | 5/2007 | Foster | |
| 7,312,517 B2 | 12/2007 | Hirata | |
| 7,425,756 B2 * | 9/2008 | Danno et al. | 257/672 |
| 7,489,022 B2 | 2/2009 | Terkington et al. | |
| 7,557,014 B2 | 7/2009 | Okamoto et al. | |
| 7,560,804 B1 | 7/2009 | Glenn | |
| 7,608,482 B1 | 10/2009 | Bayan | |
| 2010/0019379 A1 * | 1/2010 | Zhao et al. | 257/713 |

* cited by examiner

*Primary Examiner* — Khiem D Nguyen
*Assistant Examiner* — Wilner Jean Baptiste
(74) *Attorney, Agent, or Firm* — Lawrence G. Fridman

(57) ABSTRACT

A circuit packaging system allows a combination of integrated circuit dice and surface mount electronic components to be mounted on a printed circuit board which is in turn mounted on a lead frame and encapsulated, thus providing an environmentally sealed package which is manufactured using standard circuit fabrication methods and machinery.

24 Claims, 4 Drawing Sheets

CIRCUIT SYSTEM IN A PACKAGE

BACKGROUND OF THE INVENTION

1. Field of the Invention

The present invention relates generally to a packaging system for electronic circuits, and more specifically to a packaging system wherein both integrated circuits and surface mount components are attached to a printed circuit board which is mounted on a lead frame and the circuit assembly is encapsulated.

2. Description of the Prior Art

Prior art circuit packaging systems include micro lead frame package (MLP) and system in package (SIP) assemblies. MLP are generally integrated circuit packages designed to be surface mounted. FIG. 1 shows a typical MLP 10, including a lead frame 12 preferably made of copper alloy, and a molded plastic body 24 to encapsulate the contents. FIG. 4 part A describes the basic manufacturing steps for an MLP 10. The lead frame 12 is produced in step A1 and is composed of several parts, mechanically joined by thin metal sections. Typically a lead frame 12 is composed of an outer frame (not shown) that acts as a carrier and is eventually cut away, leads that will become the terminals 26 for signals power and ground, and a central die pad 28 which typically also serves as a thermal pad to provide improved heat dissipation for the integrated circuit. A thin, durable, releasable tape (not shown) is used to hold the leads in position during assembly. Lead frames are manufactured from metal sheets by chemical etching or punching, and often have some forming or bending operations to reach a final shape. In some cases the lead frame shapes can be very complex. An integrated circuit die 14 is attached to the die pad 28 per step A2, typically with some form of adhesive 22. The preferred die bonding adhesive is silver filled conductive epoxy, which is electrically and thermally conductive. Wire bonded electrical connections 18 are made between integrated circuit pads 16 and specific bonding pad areas 20 of the leads per step A3. After the encapsulation molding of step A4, the release tape is removed in step A5 and the complete package is separated in a process called singulation per step A6 from the outer portion of the lead frame by sawing or other mechanical means. MLPs are highly resistant to moisture infiltration, thus protecting the integrated circuit die. However, the lead frame as a platform for electronic components works well only for integrated circuit dice and generally poorly for any other form of circuitry, thus increasing the number of external components needed to realize most specific circuit designs, and thus also increasing the required board area and assembly expense, and decreasing the circuit durability. Additionally, the MLP is generally only designed to hold a single integrated circuit die.

SiP uses a printed circuit board instead of a lead frame and provides additional assembly options. FIG. 2 shows a typical SiP 110 configuration using a printed circuit board 44 to hold one or more integrated circuit dice 14 and surface mount components 30, attached directly to the surface of the printed circuit board 44. FIG. 4 part C describes the basic manufacturing steps for an SiP 110. The printed circuit board 44 is produced in step C1 and is composed of an insulating core 46 clad on both faces with conductive metal forming a circuit pattern and attachment pads, generally copper alloy with some form of plating over the copper. Surface mount components 30 including active, passive and fully packaged circuit devices are typically attached per step C2 using a conductive attachment material 32 which can be solder or conductive adhesive to electrically connect the components 30 to pads 34 formed in the circuit pattern. An adhesive may also be used to affix surface mount components until reflow soldering is complete. The integrated circuit die 14 attached to a die attach pad 42 on the pc board 44 with die attach adhesive 22 per step C3, after which the die 14 is wire-bonded 18 per step C4 to pads 36 formed in the circuit pattern. Conductive via holes 40 are also present in the circuit pattern to provide conductive pathways between the circuit pattern on the upper side of the printed circuit board 44 and the terminal pads 38 on the bottom side of the board. These vias 40 may also form electrical connections to conductive pathways formed within the insulating body 46 of the pc board 44. Encapsulation 24 is performed in step C5 typically through pouring a droplet of liquid resin over at least the circuit and wirebonded area, or by molding some polymer over the entire upper side of the printed circuit board and assembled contents. Since the pc board 44 in production is generally formed and assembled as a panel array of identical circuit patterns, step C6 is to singulate the circuit assemblies as individual SiPs 110. Using this technology, circuit designers can combine integrated circuits and surface mount components into a single package. This offers increased flexibility in circuit design and decreases both the number of external components required as well as the assembly cost. A disadvantage of the SiP is the exposed via holes and exposed areas of the printed circuit board. The exposed via holes can allow moisture to reach and damage the integrated circuit, and the exposed areas of the board can be degraded by moisture too.

Examples of prior art MLP systems include U.S. Pat. No. 6,630,728, U.S. Pat. No. 6,455,356 and U.S. Pat. No. 6,433,277, each of which discloses a lead frame package holding an integrated circuit die, and means for retaining lead frame based terminal pads in the molded encapsulated body of the package. While this general type of invention provides improved means for preventing terminal pad pull-out, it is not designed to be capable of incorporating other electronic components to form a more complete functional circuit. U.S. Pat. No. 7,489,022 discloses a type of lead frame package called a Quad Flat No-lead package (QFN) having a capacitive lead configured to reduce wirebond inductance and thus improve high frequency operation. The QFN is a prevalent style of MLP. U.S. Pat. No. 6,459,148 discloses a QFN having a lead frame lead structure providing increased resistance to pull-out as well as the ability to electrically connect QFNs in a vertical stack. As is the case with the other prior art MLP systems, neither of these is a design capable of incorporating other electronic components to form a more complete functional circuit.

An example of an SiP system is disclosed by U.S. Pat. No. 5,685,071 wherein integrated circuit dice are directly mounted to a printed circuit board and wirebonded to pads on the board. Surface mount components are also conductively attached to the pads in a circuit pattern on the board. However, to avoid the problem of moisture infiltration the entire circuit portion of the assembly must be passivated with silicon nitride, a step requiring very specialized equipment and not cost-effective for many potential applications. Other examples of prior art SiP systems include U.S. Pat. No. 7,557,014 which discloses multiple integrated circuit dice connected on top of a support substrate which has decoupling capacitors integrally formed. No means is taught for including discrete surface mount components or for protecting the printed circuit board. U.S. Pat. No. 7,312,517 discloses an SiP having two integrated circuits each with individual power supply wiring and power supply protective circuitry. Considerable effort has been expended to incorporate the protective circuitry as part of the integrated circuits rather than keeping it separate and no means is provided for including discrete surface mount components.

Another example of a prior art packaging system is disclosed in U.S. Pat. No. 5,504,370 wherein at least one integrated circuit die and at least one surface mount component are directly mounted to a lead frame, and electrical interconnections are formed by a combination of lead frame subsegments and wire bonds. The system is encapsulated within a molded body which encloses the lead frame except for protruding leads which must then be cut and bent to final shape. While this packaging system provides a means to combine both integrated circuit dice and surface mount components without the risk of moisture infiltration, the lead frame will require extensive configuring for any specific circuit application, and the resulting package will sit much higher than either a typical MLP or SiP package, undesirable for assembly density and miniaturization.

Yet another example of a prior art packaging system is disclosed in U.S. Pat. No. 5,311,407 wherein a lead frame has printed circuit boards attached to both top and bottom sides, with the option of mounting both integrated circuits and surface mount components to the outer faces of both boards. This system achieves a high component density and with encapsulation avoids the problem of moisture infiltration, but like the previously described system has protruding leads which must then be bent to final shape, thus adding a manufacturing operation and increasing the package footprint. The system also has a structural requirement of lead frame tabs bent and soldered through holes in the boards.

A more cost-effective, compact, robust and flexibly manufactured circuit packaging system would incorporate both integrated circuit dice and surface mount components, be itself surface mountable and of minimum size, and be capable of being manufactured quickly and cost-effectively by standard manufacturing equipment even in small lots.

SUMMARY

The circuit packaging system described herein provides the ability to manufacture an environmentally sealed encapsulated surface mountable package containing both a mixture of passive and active surface mount components, and integrated circuit dice, using standard circuit fabrication methods and manufacturing equipment.

A printed circuit board with a pattern of pads and traces on the upper side has surface mount components soldered or otherwise conductively attached to a selected group of the pads, and at least one integrated circuit die attached to a die bonding pad on the upper side too. The printed circuit board may be manufactured and at least partially assembled as part of an array pattern of printed circuit boards. Wire bonds provide electrical connections from the integrated circuit to some of the pads. The bottom side of the printed circuit board is attached to a standard metal lead frame, and wire bonds provide electrical connections between selected pads on the circuit board and wire bonding attachment areas on the lead frame. The entire assembled structure is encapsulated with molding compound, leaving the bottom surface of the lead frame exposed to serve as signal terminals, power terminals, ground terminals and thermal pads.

Additionally, the printed circuit board is preferably composed of a high frequency glass reinforced hydrocarbon/ceramic laminate, with metal coating including regions formed into pads, traces and optionally vias too, composed of gold alloy plated over copper alloy. The surface mount components may be a mixture of passive and active devices, optionally including packaged and even shielded circuit assemblies. Any surface mount device that can be reflow soldered onto a printed circuit board may be used. The lead frame may be encapsulated and then singulated in such a fashion as to permit some or all of the lead frame outer side edges to be exposed, thus increasing soldering surface area for end user attachment, as well as attachment ease and reliability.

OBJECTS AND FEATURES OF THE INVENTION

It is an object of the present invention to provide an electronic circuit packaging system enabling the incorporation of passive and active surface mount components along with integrated circuit dice in an encapsulated package.

It is another object of the present invention to provide an electronic circuit packaging system providing exposed signal, power and ground terminals as well as an exposed thermal pad, where the terminals and pads are coplanar with the package bottom surface and within the periphery of the package form, and the package is surface mountable.

It is yet another object of the present invention to provide an electronic circuit packaging system sealed against environmental contamination.

It is still another object of the present invention to provide an electronic circuit packaging system allowing the use of standard mass production techniques for both pc board arrays and lead frames.

It is a feature of the present invention to use high frequency glass reinforced hydrocarbon/ceramic laminate printed circuit board material with gold-plated copper traces, pads and vias.

It is another feature of the present invention to use wirebonding to electrically connect integrated circuit dies to printed circuit board pads.

It is yet another feature of the present invention to use wirebonding to electrically connect printed circuit board pads to lead frame pads.

It is still another feature of the present invention to permit assembly of a panelized array of pc board circuit elements and singulate these circuit elements for individual bonding to lead frames.

It is a further feature of the present invention to use standard polymer molding compounds to encapsulate the electronic circuit package.

BRIEF DESCRIPTION OF ME DRAWINGS

The present version of the invention will be more fully understood with reference to the following Detailed Description in conjunction with the drawings of which:

DESCRIPTION OF THE PREFERRED EMBODIMENT AND BEST MODE

Figure 1:
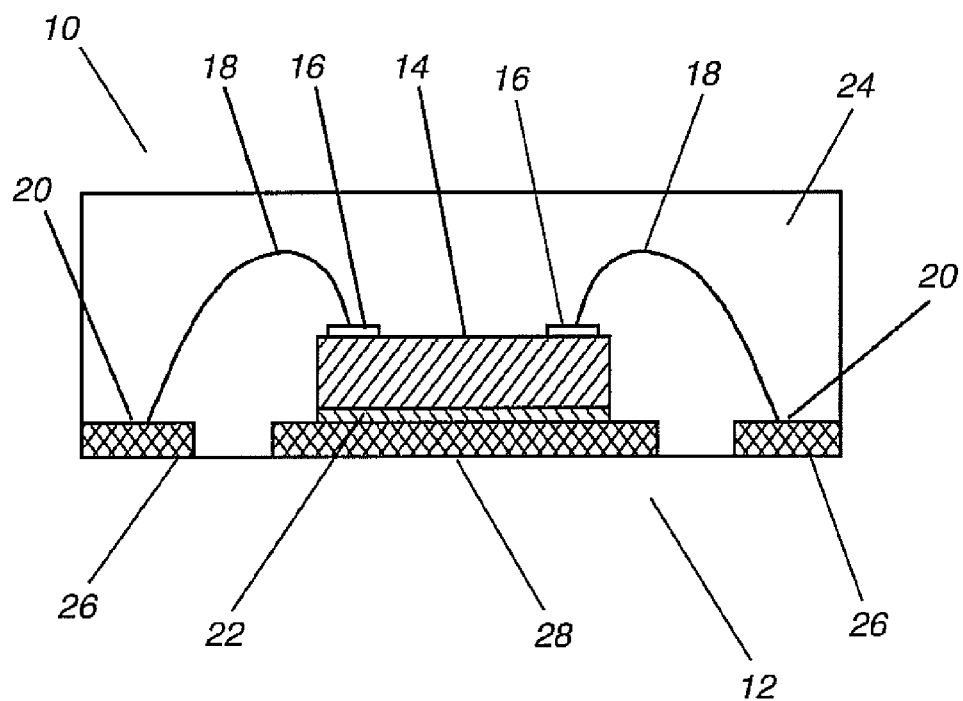
FIG. 1 is an illustration of a prior art micro lead frame package.
Figure 2:
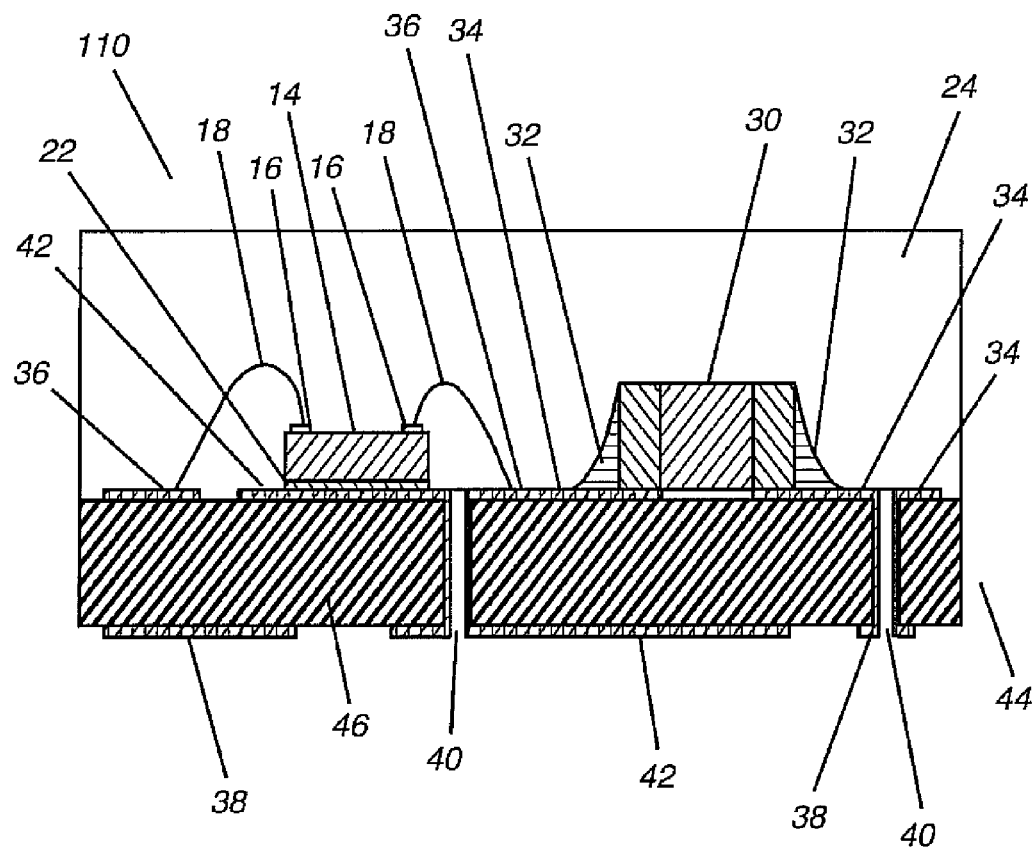
FIG. 2 is an illustration of a prior art system in package.
Figure 3:
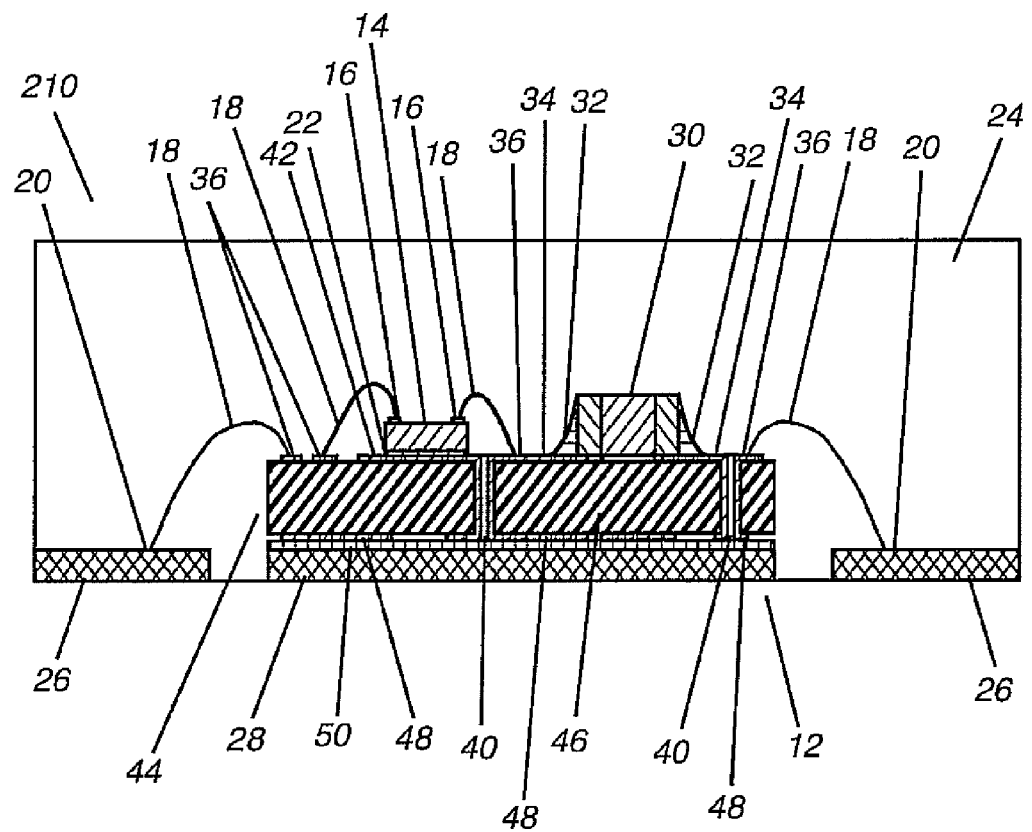
FIG. 3 is an illustration of a Minicircuits system in package.

The present invention as taught herein is referred to as the MiniCircuits System in Package or MSiP, and is depicted in FIG. 3. The MSiP 210 includes many of the best features of both the MLP and SIP style of circuit packages with some novel improvements. A printed circuit board 44 is used to mount one or more integrated circuit dice 14 and surface mount components 30. The integrated circuit die 14 is attached to the die pad 28, typically with some form of die bonding adhesive 22, and wire bonds 18 are used to make electrical connection between the integrated circuit pads 16 and circuit board bonding pad areas 36. Surface mount components, which may include passive devices such as but not limited to resistors, capacitors, diodes and inductors, active devices such as but not limited to transistors, and even packaged surface mount circuits, are typically attached to the printed circuit board 44 using a conductive attachment material 32 which can be solder or conductive adhesive to electrically connect the components 30 to pads 34 formed in the circuit pattern. Conductive via holes 40 are also present in the circuit pattern to provide conductive pathways between the circuit pattern on the upper side of the printed circuit board and any circuit pattern on the bottom side 48 or interior layers of the board. The printed circuit board is attached to a lead frame 12 with a board attachment material 50 which may chosen from a variety of adhesives including silver-filled conductive epoxy. The lead frame 12 is composed of a conductive alloy preferably coated with silver. The preferred die bonding adhesive 22 used to attach integrated circuit dice 14 and printed circuit boards 44 is a silver-filled conductive epoxy. Additionally, an adhesive may also be used to affix surface mount components until reflow soldering is complete. The integrated circuit die attachment area of the lead frame 12 typically functions as a thermal pad 28 for dissipation of circuit heat during operation. Depending on circuit configuration, multiple die pads and thus multiple thermal pads 28 may be present. Heat from integrated circuits 14 is preferably dissipated via a path comprising the conductive silver epoxy bonding the integrated circuits 14, the printed circuit metal pads and traces, the conductive via holes 40 in the pc board 44, the silver conductive epoxy attaching the pc board 44 to the lead frame 12, and finally through the lead frame bonding pad areas 20. Wire bonds 18 are also used to electrically connect between specific circuit board bonding pad areas 36 and lead frame bonding pad areas 20. These lead frame bonding pad areas 20 are typically part of the terminal pads 26 of the lead frame, being the signal, power and ground terminals. Encapsulation 24 is formed over the circuit assembly and completely encloses the circuit assembly except for the undersides of the lead frame thermal pad 28 and terminals 26, and optionally the side portions of the terminals 26.

Figure 4:
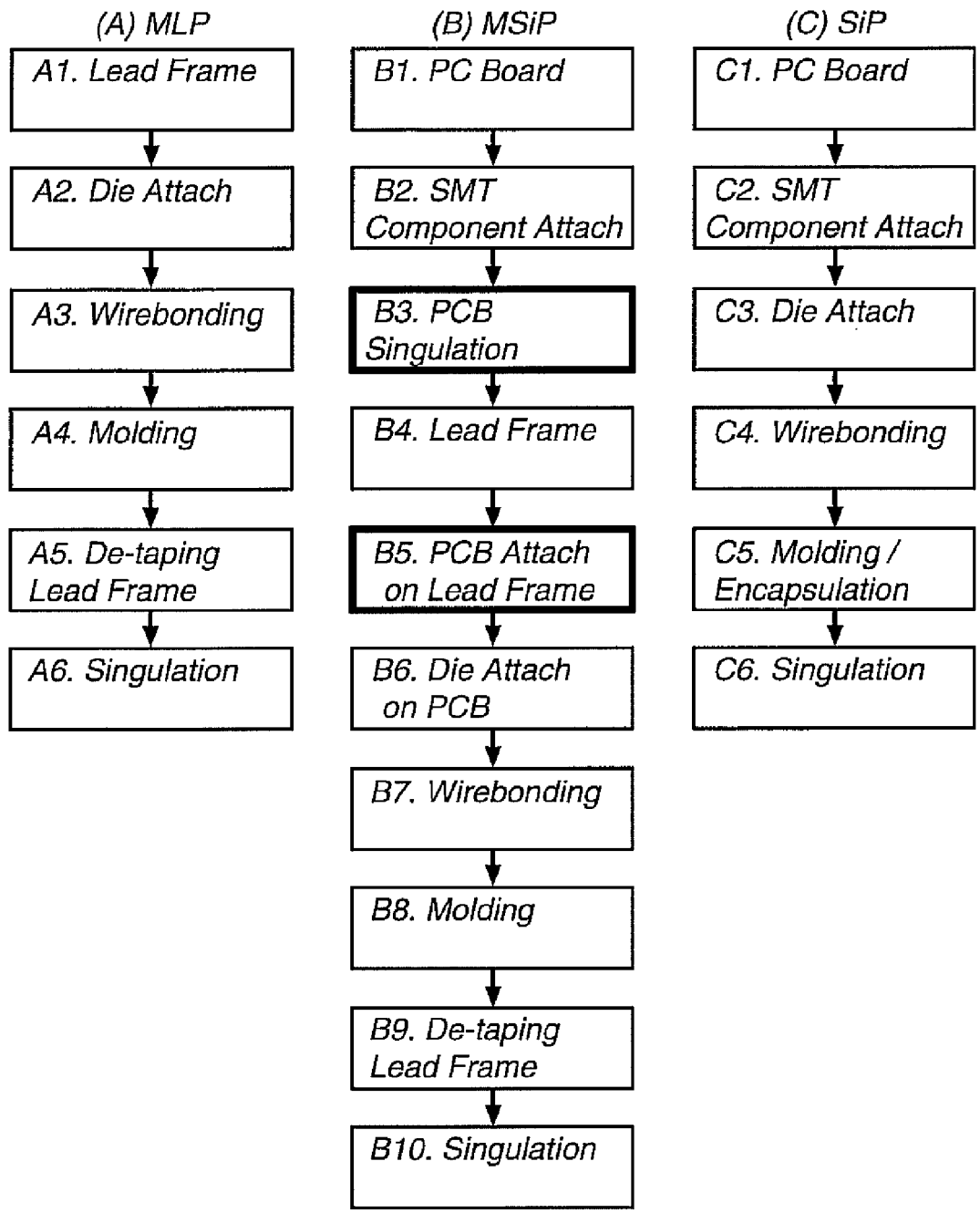
FIG. 4 is a flowchart showing the assembly steps in a micro lead frame package, a Minicircuits system in package, and a system in package.

The process of manufacturing MSiP is described in FIG. 4 part B. The pc board is produced in step B1, with die attach pads for attaching all integrated circuits, pads for conductively attaching all surface mount components, and both circuit traces and vias for all interconnections between pads. All surface mount components are conductively attached per step B2. The pc board is typically manufactured as a panel array of circuits, and is then singulated per step B3 so that each individual pc board can be further assembled. The lead frame is produced in step B4 and the individual pc board is mounted to the lead frame per step B5. One or more integrated circuit dice are attached to the pc board per step B6, typically with some form of adhesive. Wire bonded electrical connections are made between the integrated circuit pads and specific pads formed in the pc board circuit pattern, per step B7. Also in step B7, wire bonded electrical connections are made between other specific pads formed in the pc board circuit pattern and specific bonding pad areas of the lead frame. After the encapsulation molding of step B8, the tape is removed in step B9 and the complete package is singulated per step B10 from the outer portion of the lead frame by sawing or other mechanical means.

Advantages of this invention include the ability to incorporate a wide range of integrated circuit types and surface mount components into a small, environmentally sealed surface mount package to produce a custom circuit configuration at any manufacturing volume. The range of component types in the MSiP can include any mixture of active and passive electronic components, including exclusively passive components. Incorporating the components into a small package with close proximity between components also increases maximum operating frequency by shortening propagation delays between components and reducing the high frequency signal degradation effects of longer signal paths. The MSiP can be rapidly manufactured at low cost to a wide range of performance specs and package footprints, both standard and custom. Another advantage of the present invention is the ability to use a flat lead frame, rather than requiring a lead frame with additional manufacturing operations to produce bent or 3D contoured features.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A circuit packaging system comprising:
   a printed circuit board having a planar insulating body composed of a high frequency glass reinforced hydrocarbon/ceramic laminate;
   said planar body including a first surface and a second surface, wherein at least said first surface is at least partially coated with conductive metal;
   said conductive metal being a copper alloy coated with a gold alloy;
   said conductive metal being formed into a pattern of pads and circuit traces;
   at least one surface mount electronic component conductively attached to a first portion of said pattern of pads;
   at least one integrated circuit attached to said first surface with a thermally and electrically conductive adhesive and wirebonded to a second portion of said pattern of pads;
   a metal lead frame composed at least in part of a copper alloy and having a top surface, a bottom surface, and side edges, said second surface of said printed circuit board being attached with a thermally and electrically conductive adhesive to a portion of said metal lead frame top surface;
   a third portion of said pattern of pads being wirebonded to said lead frame; and,
   a molded encapsulant consisting of plastic molding compound enclosing said printed circuit board, said electronic component and said integrated circuit, said wirebonds and said metal lead frame with the exception of said bottom surface and at least portions of said side edges, thereby providing an encapsulated circuit wherein the exposed surfaces of said lead frame provides conductive connections to said circuit.

2. The circuit packaging system of claim 1, wherein at least one of said surface mount electronic component is an active device.

3. The circuit packaging system of claim 2, wherein at least one of said active device is a packaged circuit assembly.

4. The circuit packaging system of claim 1, wherein there are no integrated circuits and only passive circuit components are present.

5. The circuit packaging system of claim 1, wherein said thermally and electrically conductive epoxy contains silver.

6. The circuit packaging system of claim 1, wherein said second surface of the printed circuit board is at least partially coated with conductive metal; said pattern of pads and circuit traces is formed on a least a portion of said first surface the printed circuit board; said at least one surface mount electronic component is a plurality of said surface mounted electronic components; said metal lead frame further comprises a plurality of leads and a second portion of said pattern of pads is wirebonded to said leads; wherein said bottom surface of said lead frame leads provides conductive connections to said circuit.

7. The circuit packaging system of claim 6, wherein said plurality of surface mount electronic components further comprises at least one passive device.

8. The circuit packaging system of claim 7, wherein at least one of said active device is an integrated circuit die attached to said first surface.

9. The circuit packaging system of claim 7, wherein at least one of said active device is a packaged circuit assembly attached to said first surface.

10. The circuit packaging system of claim 8, wherein said integrated circuit die is wirebonded to a third portion of said pattern of pads.

11. The circuit packaging system of claim 8, wherein said integrated circuit die is attached to a portion of said pattern of pads with a die attaching material comprising a thermally and electrically conductive epoxy.

12. The circuit packaging system of claim 11, wherein said thermally and electrically conductive epoxy contains silver.

13. The circuit packaging system of claim 6, further comprising vias forming electrically conductive paths between said circuit traces on said first surface and circuit traces on said second surface.

14. The circuit packaging system of claim 6, wherein internal electrically conductive paths are formed within said planar insulating body and connected to said circuit traces by conductive vias.

15. The circuit packaging system of claim 6, wherein said exposed portions of said metal lead frame provide terminals selected from the group consisting of electrical signal leads, power leads, ground leads and thermally conductive pads.

16. The circuit packaging system of claim 15, wherein said encapsulated circuit has a top, a bottom and a plurality of sides; said metal lead frame has side edges; and, a portion of said side edges of said metal lead frame is exposed on said plurality of sides of said circuit packaging system thereby increasing terminal solder bonding area, ease of attachment and reliability.

17. The circuit packaging system of claim 6, wherein said conductive material is a copper alloy coated with a gold alloy.

18. The circuit packaging system of claim 6, wherein said metal lead frame is composed of a copper alloy.

19. The circuit packaging system of claim 18, wherein said metal lead frame is coated with a silver alloy.

20. The circuit packaging system of claim 6, wherein said insulating body is composed of a high frequency glass reinforced hydrocarbon/ceramic laminate.

21. The circuit packaging system of claim 6, wherein said encapsulant is a plastic molding compound.

22. The circuit packaging system of claim 6, wherein said printed circuit board includes an array of said pattern of pads and circuit traces, and after bonding said surface mount electronic components, said array is singulated into individual circuit board portions which are then each individually attached to one of said lead frame.

23. The circuit packaging system of claim 6, wherein said thermally and electrically conductive adhesive is epoxy.

24. The circuit packaging system of claim 23, wherein said thermally and electrically conductive epoxy contains silver.

* * * * *